United States Patent [19]
Sun et al.

[11] Patent Number: 6,150,286
[45] Date of Patent: Nov. 21, 2000

[54] METHOD OF MAKING AN ULTRA THIN SILICON NITRIDE FILM

[75] Inventors: Sey-Ping Sun, Austin; Mark I. Gardner, Cedar Creek; Shengnian Song, Austin, all of Tex.

[73] Assignee: Advanced Micro Devices, Inc., Sunnyvale, Calif.

[21] Appl. No.: 09/477,050

[22] Filed: Jan. 3, 2000

[51] Int. Cl.$^7$ .......................... H01L 21/31; H01L 21/469
[52] U.S. Cl. ............................. 438/791; 438/958
[58] Field of Search ..................................... 438/787, 238, 438/398, 762, 253, 791, 958, 786; 257/645

[56] References Cited

U.S. PATENT DOCUMENTS

| | | | |
|---|---|---|---|
| 5,258,333 | 11/1993 | Shappir et al. | 437/235 |
| 5,516,707 | 5/1996 | Loh et al. | 437/24 |
| 5,559,368 | 9/1996 | Hu et al. | 257/369 |
| 5,578,848 | 11/1996 | Kwong et al. | 257/296 |
| 5,596,218 | 1/1997 | Soleimani et al. | 257/369 |
| 5,939,763 | 8/1999 | Hao et al. | 257/411 |
| 6,045,954 | 4/2000 | Dai et al. | 430/5 |

OTHER PUBLICATIONS

Stanley Wolf and Richard N. Tauber; *Silicon Processing for the VLSI Era; vol. 1: Process Technology*; pp. 210–226; 1986.

Stanley Wolf and Richard N. Tauber; *Silicon Processing for the VLSI Era; vol. 2: Process Integration*; pp. 182–188, 222–235, 318, 332–333, 354–361 and 419–439; 1990.

Stanley Wolf and Richard N. Tauber; *Silicon Processing for the VLSI Era; vol. 3: The Submicron MOSFET*; pp. 367–407 and 648–660; 1995.

*Primary Examiner*—Matthew Smith
*Assistant Examiner*—Calvin Lee
*Attorney, Agent, or Firm*—Timothy M. Honeycutt

[57] ABSTRACT

Various methods of fabricating a circuit structure utilizing silicon nitride are provided. In one aspect, a method of fabricating a circuit structure is provided that includes forming a silicon nitride film on a silicon surface, annealing the silicon nitride film in an ammonia ambient and annealing the silicon nitride film in a nitrous oxide ambient to form a thin oxide layer at an interface between the silicon nitride film and the silicon surface. The process of the present invention enables the manufacture of thin silicon nitride films with highly uniform morphology for use as gate dielectrics or other purposes. The thin oxide film is self-limiting in thickness and improves differential mechanical stresses.

18 Claims, 3 Drawing Sheets

METHOD OF MAKING AN ULTRA THIN SILICON NITRIDE FILM

BACKGROUND OF THE INVENTION

1. Field of the Invention

This invention relates generally to semiconductor processing, and more particularly, to a method of fabricating a silicon nitride film on a substrate.

2. Description of the Related Art

Scaling of field effect transistor devices has historically been, and continues to be a fundamental goal in the semiconductor fabrication industry. The continual drive toward higher circuit density has been fueled by demands from ordinary consumers, industry, government and the military for ever increasing speed, capability and miniaturization of electronic products, as well as the desire of semiconductor manufacturers to reduce manufacturing costs. Scaling efforts have thus far been highly successful. Three micron processing, considered state of the art a little more than a decade ago, has given way to sub-micron processing.

As in many aspects of semiconductor processing, current scaling efforts involve a set of trade-offs between higher packing density and better performance, and short channel effects. As process technologies scaled below about 2.0 $\mu$m, a series of design difficulties arose stemming from the semiconductor physics associated with short-channel devices. Hot carrier effects and subthreshold leakage currents become much more problematic in short channel devices, such as modem field effect transistors in sub-2.0 $\mu$m processing. If not compensated for through processing techniques or other means, such effects can either reduce device performance or lead to device failure or both.

One technique to combat short channel effects has involved the scaling of gate dielectrics. To compensate for the potentially lower drive currents for a given short channel device, conventional silicon dioxide gate oxide layers are made as thin as possible to maximize drive current. However, the scaling of silicon dioxide gate dielectric layers has introduced another set of problems. To begin with, very thin silicon dioxide layers have been historically difficult to fabricate with a consistent thickness across a given wafer, from wafer to wafer and from lot to lot. In addition, as the thickness of silicon dioxide is scaled downward, the potential for reliability problems associated with dielectric breakdown and hot and cold carrier injection degradation increases. Hot and cold carrier degradation can significantly reduce device performance, while dielectric breakdown can lead to complete device failure.

One potential cause of carrier injection and potential dielectric breakdown is thought to occur as a result of interface traps near the Si—$SiO_2$ interface. Interface traps are the apparent result of dangling silicon bonds at the Si—$SiO_2$ interface. Dangling Si bonds represent sites where hot carrier injection, Fowler-Nordheim tunneling and direct tunneling can occur. Although tunneling is thought to arise as a natural consequence of the quantum mechanical nature of electrons positioned near a very thin oxide layer, dangling Si bonds appear to aggravate the problem. Independent of the exact physical cause of carrier injection, the empirical result for very thin oxides may be gate leakage currents and/or catastrophic device failure.

Another difficulty associated with very thin conventional gate oxides is polysilicon depletion. In p-channel transistors with polysilicon gate electrodes, the source and drain are commonly formed in the substrate by implanting a p-type dopant, such as boron. The implant also deposits boron into the polysilicon of the gate electrode. Subsequent thermal processing steps to fabricate a conventional p-channel field effect transistor frequently cause boron to diffuse from the gate electrode through the gate oxide layer and into the channel region. If the amount of boron diffused is sufficiently high, the electrical performance of the field effect transistor may be severely degraded due to polysilicon depletion. The potential for boron diffusion increases with decreasing oxide thickness.

Silicon nitride has been previously proposed as an alternative to silicon dioxide as a gate dielectric material. With a dielectric constant of about 6–9 (nearly twice that of silicon dioxide) a silicon nitride gate dielectric may be fabricated with a greater thickness than a comparable oxide layer while still achieving the same capacitance per unit area. The result is better resistance to tunneling effects and dielectric breakdown without sacrificing drive current. Silicon nitride also is more resistant to diffusion and thus to polysilicon depletion.

Low pressure chemical vapor deposition ("LPCVD") and plasma enhanced chemical vapor deposition ("PECVD") represent two commonly used techniques for depositing silicon nitride films. LPCVD silicon nitride is usually formed by reacting dichlorosilane and ammonia at temperatures above 700° C. Such films have relatively high tensile stresses (on the order of about $1-2\times10^{10}$ dynes/cm$^2$), and the high temperature required for their fabrication consumes thermal budget. Furthermore, adequate control of film thickness uniformity for thicknesses under about 50 Å has proven to be difficult.

PECVD silicon nitride is usually formed by reacting silane and ammonia in a plasma ambient at about 200 to 400° C. These types of silicon nitride films frequently exhibit mechanical stresses that are compressive and an order of magnitude lower than LPCVD silicon nitride films. Film thickness uniformity is generally more controllable in PECVD processes than in LPCVD processes. However, in the regimen of film thicknesses less than about 50 Å, conventional PECVD silicon nitride deposition processes also produce variations in film thickness. The problem is thought to stem from the high silane flow rates and the sequence of plasma excitation and silane flow used in current processes. Higher silane flow rates generally speed the silicon nitride forming reaction and make the task of thickness control more difficult. Some conventional processes excite the plasma prior to the introduction of silane into the reaction chamber. Exciting the plasma prior to silane flow can cause the resulting silane-ammonia plasma to exhibit instability, which produces variations in film thickness.

Some conventional processes have utilized a composite thermal oxide-silicon nitride stack as a gate dielectric. A thermal oxide film is first grown on the silicon wafer. A silicon nitride film is next deposited on the oxide. The aforementioned process limitations associated with nitride films apply in this context as well. Furthermore, the conventional gate oxide growth process used to fabricate these types of composite layers is not self-limiting and thus somewhat difficult to control, particularly where very thin oxides are required.

The present invention is directed to overcoming or reducing the effects of one or more of the foregoing disadvantages.

SUMMARY OF THE INVENTION

In accordance with one aspect of the present invention, a method of fabricating a circuit structure is provided that includes forming a silicon nitride film on a silicon surface, annealing the silicon nitride film in an ammonia ambient and annealing the silicon nitride film in a nitrous oxide ambient to form a thin oxide layer at an interface between the silicon nitride film and the silicon surface.

In accordance with another aspect of the present invention, a method of fabricating a circuit structure on a silicon substrate is provide that includes forming a silicon nitride film on the substrate, annealing the silicon nitride film in an ammonia ambient and annealing the silicon nitride film in a nitrous oxide ambient to form a thin oxide layer at an interface between the silicon nitride film and the silicon substrate.

In accordance with another aspect of the present invention, a method of fabricating a gate dielectric on a silicon substrate is provided that includes depositing a silicon nitride film on the substrate by plasma enhanced chemical vapor deposition, annealing the silicon nitride film in an ammonia ambient and annealing the silicon nitride film in a nitrous oxide ambient to form a thin oxide layer at an interface between the silicon nitride film and the substrate.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
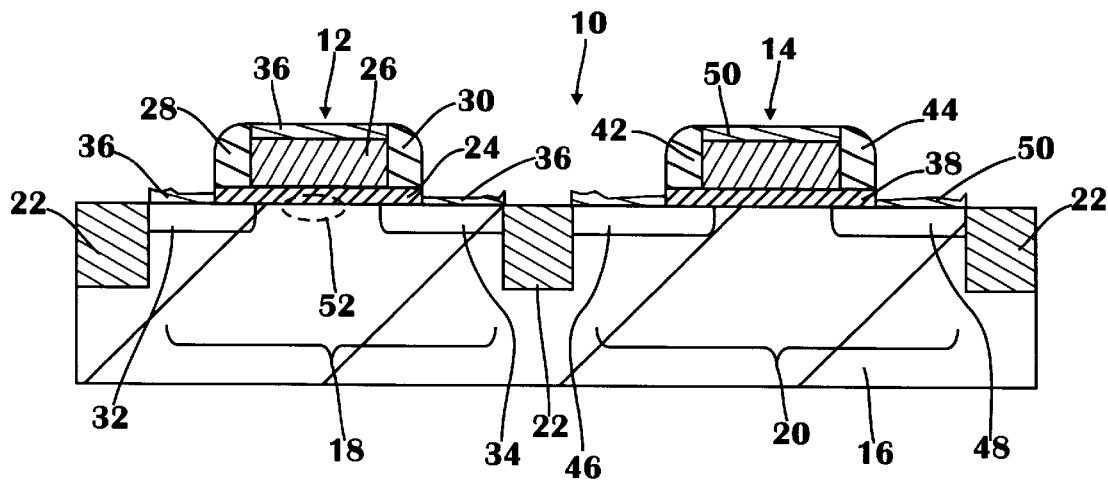
FIG. 1 is a cross-sectional view of an exemplary embodiment of an integrated circuit implemented on a substrate in accordance with the present invention.

In the drawings described below, reference numerals are generally repeated where identical elements appear in more than one figure. FIG. 1 depicts a cross-sectional view of an integrated circuit 10 that includes a plurality of transistors and other devices. Two of the transistors are depicted and designated 12 and 14 respectively. The transistors 12 and 14 are implemented on a semiconductor substrate 16. Only a very small portion of the substrate 16 is visible in FIG. 1. The transistor 12 is implemented on an active area 18 of the substrate 16 and the transistor 14 is implemented on an adjacent active area 20 of the substrate 16. The active areas 18 and 20 are electrically isolated laterally by isolation structure 22. The transistor 12 is provided with a gate insulating layer 24 positioned on the substrate 16 and a gate electrode 26 positioned on the gate insulating layer 24. The gate electrode 26 is bracketed by a pair of insulating spacers 28 and 30 which are positioned on portions of the gate insulating layer 24 that extend laterally to either side of the gate electrode 26. Single graded source/drain regions 32 and 34 are formed in the substrate 16 beneath the gate electrode 26 and with a slight overlap therewith. The phrase "source/drain region(s)" is used herein to describe a region that may serve as either a source or a drain. The skilled artisan will appreciate that a source/drain region may function as a source or a drain depending upon how it is interconnected with subsequent metallization. Enhanced ohmic contact between the source/drain regions 32 and 34, the gate electrode 26 and subsequent contacts (not shown) is established by a silicide film 36.

The transistor 14 is similarly provided with a gate insulating layer 38, a gate electrode 40, insulating spacers 42 and 44, source/drain regions 46 and 48 and a silicide film 50. If the transistors 12 and 14 are implemented as the same type of logic device, that is, n-channel or p-channel, the components of the two transistors 12 and 14 may be substantially identical. If, however, the transistors 12 and 14 are implemented, for example in CMOS, the source/drain regions 32 and 34 may have an opposite conductivity type, e.g., n-type or p-type, from the source/drain regions 46 and 48.

Figure 2:
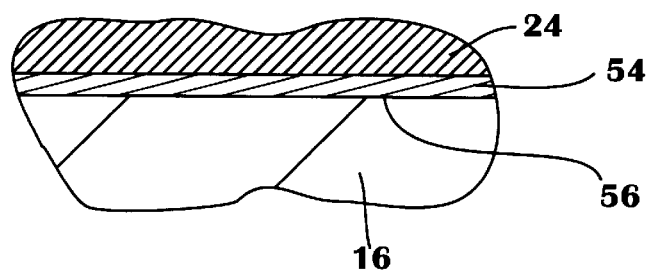
FIG. 2 is a magnified cross-sectional view of a selected portion of FIG. 1 in accordance with the present invention.

The detailed structure of the gate insulating layer 24 is exemplary of the gate insulating layer 38 as well and may be understood by referring now also to FIG. 2, which is a magnified view of the portion of FIG. 1 circumscribed generally by the dashed oval 52. A very thin oxide layer 54 is interposed between the gate insulating layer 24 and the Si—$SiO_2$ interface 56. The layer 54 is extremely thin, on the order of 1 to 3 Å and is fabricated by a $N_2O$ anneal to be described below. The thin oxide layer 54 lowers the potential for trap charges associated with nitride in contact with silicon and improves the surface stress associated with a nitride-to-silicon interface. Thus, the benefits of the higher dielectric constant of silicon nitride are obtained with improved device characteristics at the Si—$SiO_2$ interface 56.

Figure 3:
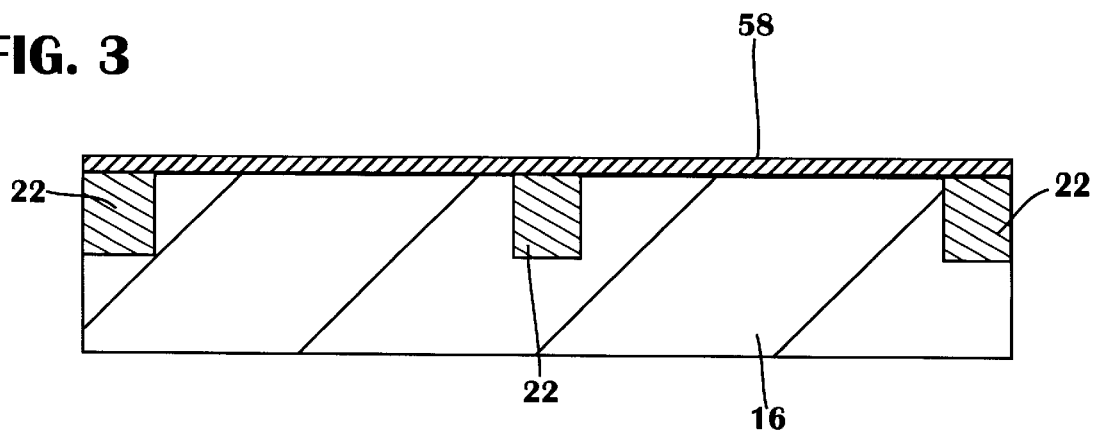
FIG. 3 is a cross-sectional view of the substrate of FIG. 1 depicting the thermal formation of a silicon nitride film thereon in accordance with the present invention.

An exemplary process flow for fabricating the transistors 12 and 14 depicted in FIG. 1 in accordance with the present invention may be understood by referring now to FIGS. 3, 4, 5 and 6, and initially to FIG. 3. Initially, the isolation structure 22 is fabricated in the substrate 16. The structure 22 may be a trench isolation structure, a field oxide region or the like and may be fabricated using well known conventional techniques for fabricating such isolation structures. Next, the substrate 16 next undergoes an multi-stage cleaning process to remove any particulate and organic contaminants and to remove any native oxide in advance of a silicon nitride deposition. In the first stage, the substrate 16 is subjected to a series of liquid cleans utilizing ammonium hydroxide, peroxide and water and sulfuric acid peroxide and water. The substrate 16 is next subjected to an HF dip with, for example, a 50:1 to 100:1 $H_2O$ to HF concentration to etch away any native oxide.

After the substrate 16 has been cleaned, a silicon nitride film 58 is fabricated thereon in a processing chamber (not shown), preferably without breaking vacuum. Through subsequent processing, the silicon nitride film 58 will be patterned into the respective gate insulating layers 24 and 38 depicted in FIG. 1. In an exemplary embodiment, the silicon nitride film 58 is established with thickness of about 10 to 20 Å by using PECVD with a mixture of silane, ammonia and nitrogen. The gaseous mixture may be about 345 to 405 sccm silane, about 2850 to 3150 sccm ammonia and about 2600 to 3000 sccm nitrogen. A split power scheme is utilized wherein high frequency power is applied to the plasma at about 313 to 373 watts and low frequency power is applied at about 117 to about 177 watts. The pressure of the plasma is about 1.7 to 2.1 torr and the temperature is about 380 to 420° C. It is anticipated that this PECVD recipe will yield a deposition rate of about 600 to 700 Å/minute.

In order to avoid the problems of film thickness variation due to plasma instability, silane, nitrogen and ammonia flows are commenced a short instant prior to plasma excitation and continued for a short duration after plasma excitation is cutoff. In this illustrative embodiment, the gas flows are started about 1.0 second prior to plasma excitation, and continued for about 0.5 second after plasma excitation cutoff. At the aforementioned deposition rates, the film 58 with a thickness of 10 to 20 Å may be produced with a total deposition time of about 1.7 to 2.1 seconds including the pre and post-plasma excitation flow times.

The substrate 16 is next subjected to an anneal in an ammonia ambient to passivate the silicon nitride film 58 followed by an anneal in an $N_2O$ ambient. The ammonia anneal is performed at about 700 to 900° C. for about 2 to 20 seconds in a rapid thermal anneal ("RTA") process or for about 30 minutes in a furnace process. The chamber is then flushed with nitrogen and the $N_2O$ anneal is performed at about 700 to 1000° C. for about 5 to 30 seconds in an RTA process. Optionally, a single anneal may be performed with a mixture of $NH_3$ and $N_2O$ at about 700 to 1000° C. for about 5 to 30 seconds in an RTA process.

It is anticipated that the $N_2O$ anneal will establish the thin oxide film 54 at the Si—$SiO_2$ interface 56. The nitride film 58 is generally resistant to the diffusion of dissociated oxygen from the $N_2O$, but is nevertheless thin enough to permit enough oxygen to migrate to the Si—$SiO_2$ interface 56 and form the oxide film 54. As a result of the resistance of the nitride film 58 to oxygen diffusion, the growth of the oxide film 54 is self-limiting. In this way, a nitride gate dielectric may be fabricated with a very thin underlying oxide film.

Depending on the concentration of $N_2O$ in the chamber, the film 54 may have a composition that more closely resembles silicon oxynitride (with the formula $SiO_xN_y(H_z)$) than pure oxide. With such a composition, the film 54 will still exhibit favorable bonding to the substrate 16 and the nitride 58 as well as desirable insulating properties.

Figure 4:
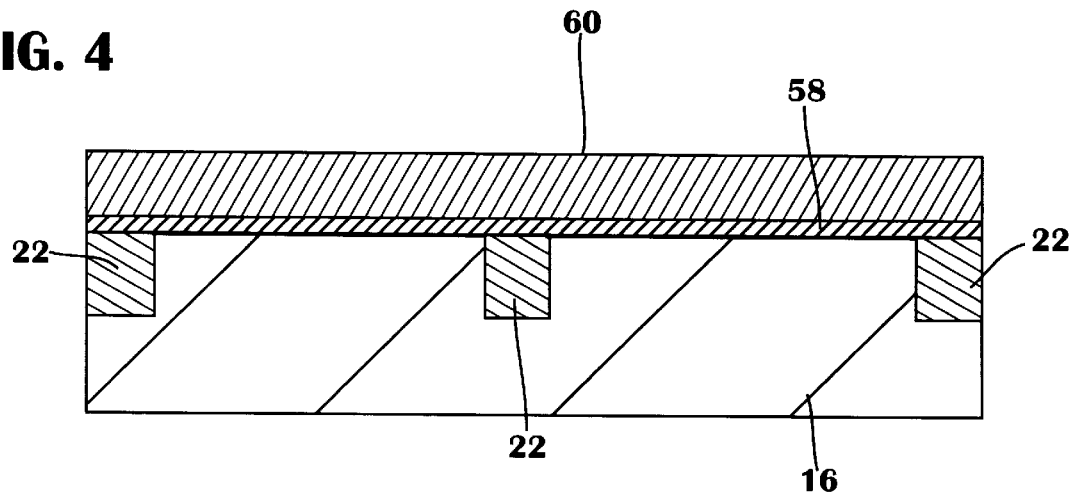
FIG. 4 is a cross-sectional view like FIG. 3 depicting the formation of a conductor layer on the silicon nitride film in accordance with the present invention.
Figure 5:
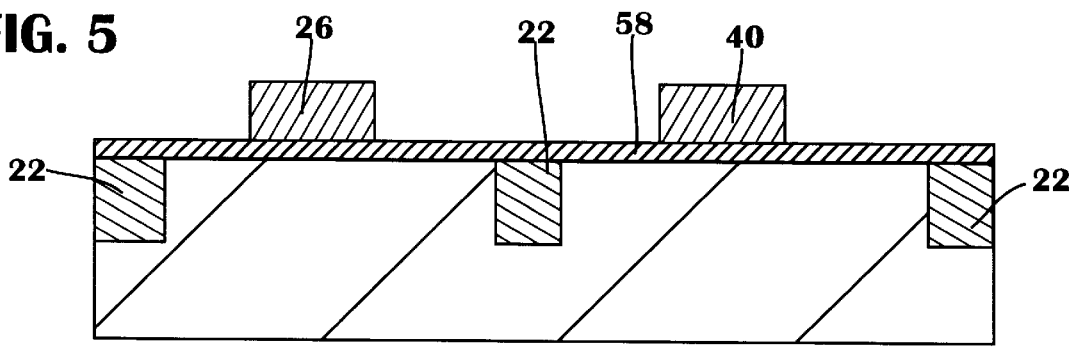
FIG. 5 is a cross-sectional view like FIG. 4 depicting the patterning of the conductor layer to define transistor gate electrodes in accordance with the present invention.

The fabrication of the gate electrodes 26 and 40 may be understood by referring now to FIGS. 4 and 5. Referring initially to FIG. 4, a conductor film 60 is blanket deposited on the silicon nitride film 58. Depending upon device requirements, the conductor film 60 may be composed of a variety of materials commonly used for gate electrode construction, such as, for example, polysilicon, amorphous silicon, aluminum, aluminum-copper, suicides, tungsten, titanium, tantalum, tantalum nitride or the like. In an exemplary embodiment, the conductor film 60 is composed of polysilicon deposited by well known CVD techniques, and may be about 700 to 1500 Å in thickness. Through subsequent doping, the film 60 will be rendered conductive for gate electrode purposes. Referring now also to FIG. 5, the film 60 depicted in FIG. 4 is masked and anisotropically etched to yield the gate electrodes 26 and 40. The etch to define the gate electrodes 26 and 40 may be by chemical plasma etching, reactive ion etching or the like and may use a variety of etch chemistries suitable to anisotropically etch polysilicon, such as, for example, $CF_4/O_2$.

Figure 6:
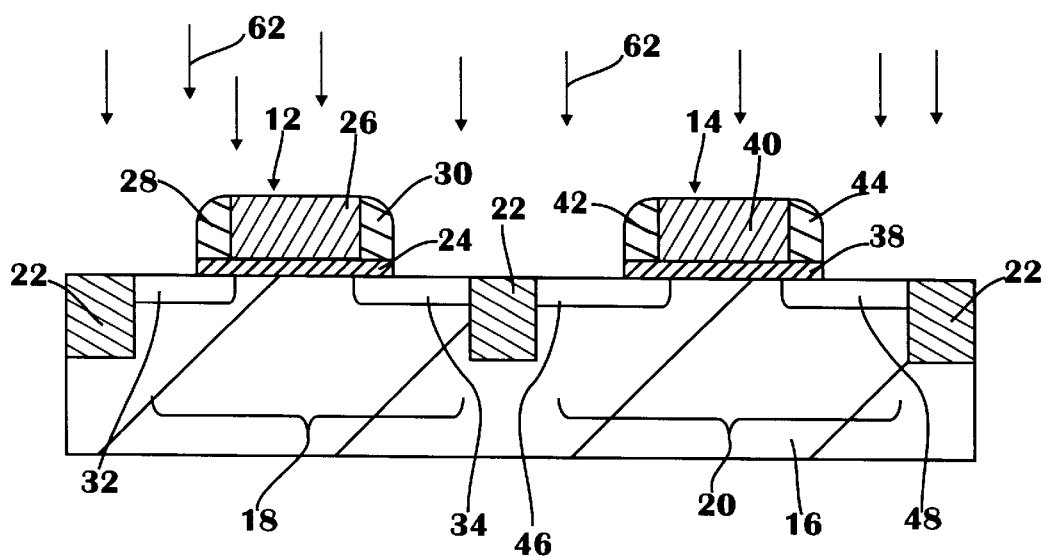
FIG. 6 is cross-sectional view like FIG. 5 depicting the formation of sidewall spacers and source/drain regions in accordance with the present invention.

The fabrication of the spacers 28, 30, 42 and 44 and the source/drain regions 32, 34, 46 and 48 may be understood by referring now to FIG. 6. Initially, the spacers 28, 30, 42 and 44 are fabricated by either oxidizing the exposed surfaces of the gate electrodes 26 and 40 or CVD and subsequently performing an anisotropic oxide etch to yield the defined spacers as shown in FIG. 6. The spacer etch may be by chemical plasma etching, reactive ion etching or the like and may use a variety of chemistries suitable for etching oxide, such as, for example, $CF_4$. The gate insulating layers 24 and 38 may be defined from the nitride film 58 depicted in FIG. 5 at this point by anisotropic etching as shown. Optionally, the etch definition of the insulating layers 24 and 38 may be delayed until after the implants to establish the source/drain regions 32, 34, 46 and 48 so that the film 58 depicted in FIG. 5 may serve as an implant screen. Next, the source/drain regions 32, 34, 46 and 48 are established in the respective active areas 18 and 20 by implantation of impurity ions 62. If the transistors 12 and 14 will be implanted as opposite device types, the implant of the impurity ions will be broken up into two separate implants using ions of opposite conductivity type and sequential, flip-flopped masking of the respective active areas 18 and 20. Note also that dual grading of source/drain regions may be implemented by performing LDD implants prior to formation of the spacers 28, 30, 42 and 44.

Referring again to FIG. 1, the substrate 16 is subjected to an RTA anneal to activate the source/drain regions 32, 34, 46 and 48 and to repair any implant damage. The anneal produces the gate-to-drain overlap depicted in FIG. 1. The silicide films 36 and 50 may then be established using well known salicidation techniques. For example, cobalt may be blanket deposited and subjected to a two stage anneal to first establish cobalt monosilicide and to subsequently initiate a phase change to cobalt disilicide. Any unreacted cobalt may then be removed by well known etching techniques.

Figure 7:
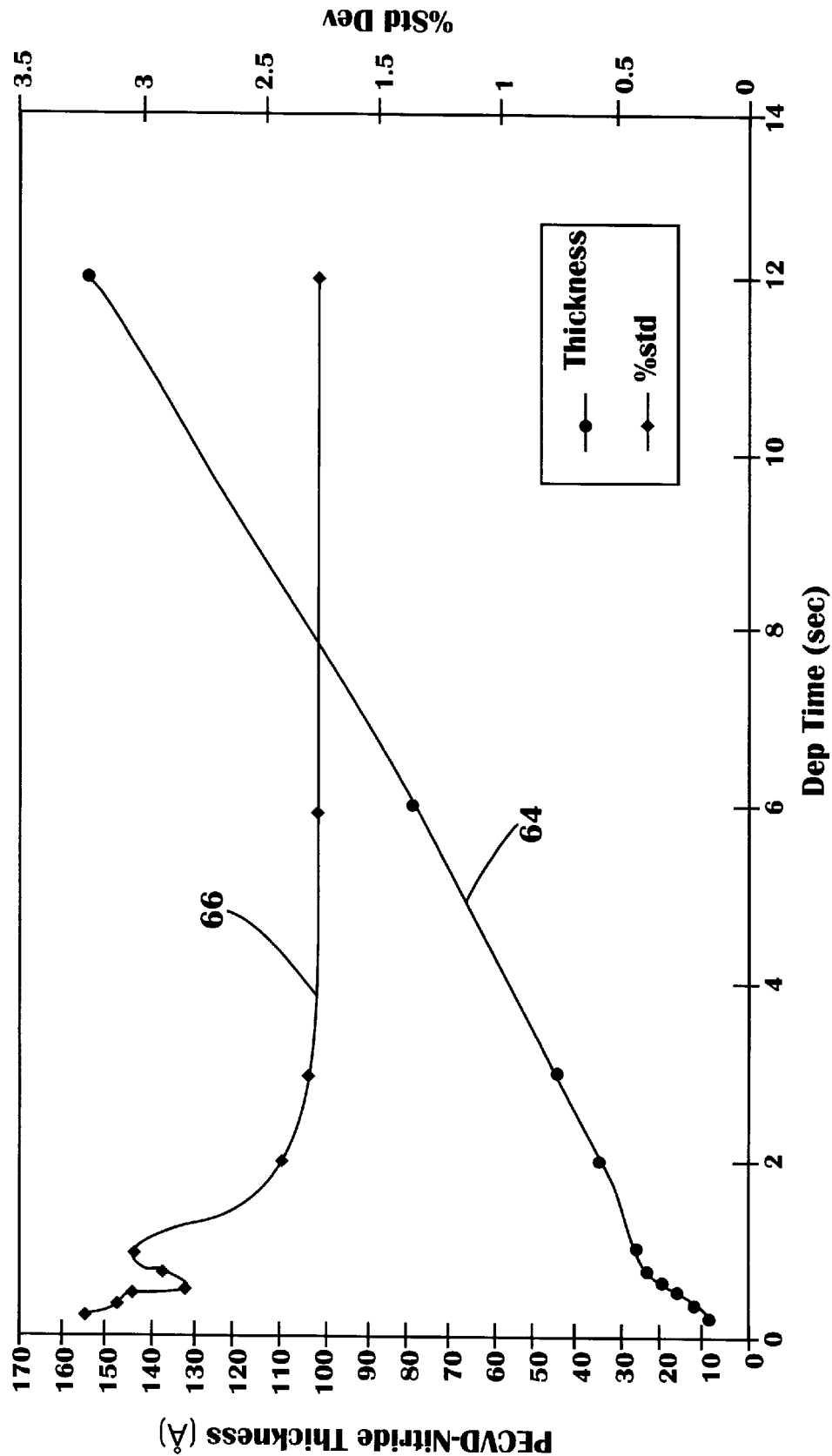
FIG. 7 is graph depicting a plot of average silicon nitride film thickness as a function of deposition time for a series of test wafers, and a plot of percentage standard deviation in silicon nitride film thickness across the surface of each of the test wafers as a function of deposition time in accordance with the present invention.

Ten test wafers were subjected to the aforementioned silicon nitride PECVD process and the resulting silicon nitride films of the type depicted and designated 58 in FIG. 3 above were subjected to probe testing to measure thickness across the substrate 16. The results of those tests are summarized in the following table and in the graph depicted in FIG. 7. FIG. 7 shows a plot 64 of average silicon nitride film thickness as a function of deposition time for each of the ten test wafers, and a plot 66 of the percentage standard deviation in silicon nitride film thickness across the surface of each of the test wafers as a function of deposition time.

| TEST WAFER | DEPOSITION TIME (S) | MEAN SILICON NITRIDE FILM THICKNESS (Å) | % STANDARD DEVIATION |
| --- | --- | --- | --- |
| 1 | 0.2 | 9.9 | 3.176 |
| 2 | 0.3 | 12.21 | 3.04 |
| 3 | 0.4 | 15.202 | 2.969 |
| 4 | 0.5 | 17.82 | 2.721 |
| 5 | 0.6 | 20.5 | 2.833 |
| 6 | 0.9 | 23.57 | 2.963 |
| 7 | 1.8 | 34.92 | 2.241 |
| 8 | 3.0 | 48.84 | 2.105 |
| 9 | 6.0 | 83.36 | 1.983 |
| 10 | 12.0 | 155.71 | 1.922 |

As the table shows, the process in accordance with the present invention yields a high quality silicon nitride film with a highly uniform thickness that has a maximum percent standard of deviation of about 3.2% down to a minimum of about 1.9%.

The skilled artisan will appreciate that the process of the present invention enables the manufacture of thin silicon nitride films for use as gate dielectrics or other purposes with highly uniform morphology. In addition, the process provides for the formation of a thin oxide film between the silicon nitride film and the underlying substrate. The thin oxide film is self-limiting in thickness and improves differential mechanical stresses.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a circuit structure, comprising:
   forming a silicon nitride film on a silicon surface;
   annealing the silicon nitride film in an ammonia ambient; and
   forming a thin oxide layer at an interface between the silicon nitride film and the silicon surface by annealing the silicon nitride film in a nitrous oxide ambient.

2. The method of claim 1, wherein the annealing in an ammonia ambient is performed simultaneously with the annealing in the nitrous oxide ambient.

3. The method of claim 1, wherein the silicon nitride film is formed by plasma enhanced chemical vapor deposition.

4. The method of claim 3, wherein a flow of silane and a flow of ammonia are reacted in a plasma, the flow of silane and the flow of ammonia being started prior to the initiation of the excitation of the plasma and stopped after the cutoff of the plasma excitation.

5. The method of claim 1, comprising forming a gate electrode on the silicon nitride film.

6. The method of claim 5, comprising forming a first spacer and a second spacer adjacent to the gate electrode and forming a first source/drain region and a second source/drain region.

7. A method of fabricating a circuit structure on a silicon substrate, comprising:
   forming a silicon nitride film on the substrate;
   annealing the silicon nitride film in an ammonia ambient; and
   forming a thin oxide layer at an interface between the silicon nitride film and the silicon substrate by annealing the silicon nitride film in a nitrous oxide ambient.

8. The method of claim 7, wherein the annealing in an ammonia ambient is performed simultaneously with the annealing in the nitrous oxide ambient.

9. The method of claim 7, wherein the silicon nitride film is formed by plasma enhanced chemical vapor deposition.

10. The method of claim 9, wherein a flow of silane and a flow of ammonia are reacted in a plasma, the flow of silane and the flow of ammonia being started prior to the initiation of the excitation of the plasma and stopped after the cutoff of the plasma excitation.

11. The method of claim 7, comprising forming a gate electrode on the silicon nitride film.

12. The method of claim 11, comprising forming a first spacer and a second spacer adjacent to the gate electrode and forming a first source/drain region and a second source/drain region.

13. A method of fabricating a gate dielectric on a silicon substrate, comprising:
   depositing a silicon nitride film on the substrate by plasma enhanced chemical vapor deposition;
   annealing the silicon nitride film in an ammonia ambient; and
   forming a thin oxide layer at an interface between the silicon nitride film and the substrate by annealing the silicon nitride film in a nitrous oxide ambient.

14. The method of claim 13, wherein the annealing in an ammonia ambient is performed simultaneously with the annealing in the nitrous oxide ambient.

15. The method of claim 13, wherein a flow of silane, a flow of ammonia and a flow of nitrogen are reacted in a plasma, the flow of silane and the flow of ammonia being started prior to the initiation of the excitation of the plasma and stopped after the cutoff of the plasma excitation.

16. The method of claim 15, wherein the flow of silane is about 345 to 405 sccm, the flow of ammonia is about 2850 to 3150 sccm and the flow of nitrogen is about 2600 to 3000 sccm.

17. The method of claim 13, comprising forming a gate electrode on the silicon nitride film.

18. The method of claim 17, comprising forming a first spacer and a second spacer adjacent to the gate electrode and forming a first source/drain region and a second source/drain region.

* * * * *